(12) United States Patent
Kashiwagi et al.

(10) Patent No.: US 9,117,978 B2
(45) Date of Patent: Aug. 25, 2015

(54) THERMOSETTING SILICONE RESIN SHEET AND METHOD FOR PRODUCING THE SAME, AND LIGHT-EMITTING APPARATUS USING THE THERMOSETTING SILICONE RESIN SHEET AND METHOD FOR PRODUCING THE SAME

(71) Applicant: SHIN-ETSU CHEMICAL CO., LTD., Tokyo (JP)

(72) Inventors: Tsutomu Kashiwagi, Annaka (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/058,871

(22) Filed: Oct. 21, 2013

(65) Prior Publication Data

US 2014/0124809 A1   May 8, 2014

(30) Foreign Application Priority Data

Nov. 2, 2012   (JP) ................................. 2012-242680

(51) Int. Cl.
  *H01L 33/50*  (2010.01)
  *B32B 3/10*  (2006.01)
  *B32B 3/16*  (2006.01)
  *C08L 83/04*  (2006.01)
  *C08K 3/22*  (2006.01)

(52) U.S. Cl.
  CPC ................ *H01L 33/501* (2013.01); *B32B 3/10* (2013.01); *B32B 3/16* (2013.01); *C08L 83/04* (2013.01); *C08K 2003/221* (2013.01); *H01L 2924/0002* (2013.01); *H01L 2933/0041* (2013.01)

(58) Field of Classification Search
  None
  See application file for complete search history.

(56) References Cited

U.S. PATENT DOCUMENTS

| 2004/0094757 | A1  | 5/2004  | Braune et al. |
| 2004/0214966 | A1  | 10/2004 | Tabei et al. |
| 2010/0148378 | A1* | 6/2010  | Katayama et al. ............ 257/791 |
| 2013/0113008 | A1* | 5/2013  | Shiobara et al. ............. 257/98 |
| 2013/0125365 | A1* | 5/2013  | Goto et al. ..................... 29/428 |

FOREIGN PATENT DOCUMENTS

| JP | 2004-339482 |   | 12/2004 |
| JP | 2005-524737 |   | 8/2005 |
| JP | 2009-94351 |   | 4/2009 |
| WO | WO 2011/102272 | * | 8/2011 |

* cited by examiner

*Primary Examiner* — Marc Zimmer
(74) *Attorney, Agent, or Firm* — Oliff PLC

(57) ABSTRACT

The present invention provides a thermosetting silicone resin sheet having a phosphor-containing thermosetting silicone resin layer formed in the form of an LED device and a method for producing the same, and a light-emitting apparatus using the thermosetting silicone resin sheet and a method for producing the same. The present invention was accomplished by the phosphor-containing thermosetting silicone resin sheet comprising a substrate film and a phosphor-containing thermosetting silicone resin layer that is a plastic solid or a semi-solid at room temperature composed of a single layer having no adhesive layer, formed by printing and molding a phosphor-containing thermosetting silicone resin composition on the substrate film in the form of an LED device.

14 Claims, 2 Drawing Sheets

THERMOSETTING SILICONE RESIN SHEET AND METHOD FOR PRODUCING THE SAME, AND LIGHT-EMITTING APPARATUS USING THE THERMOSETTING SILICONE RESIN SHEET AND METHOD FOR PRODUCING THE SAME

TECHNICAL FIELD

The present invention relates to a thermosetting silicone resin sheet having a phosphor-containing thermosetting silicone resin layer and a method for producing the same, and a light-emitting apparatus using the thermosetting silicone resin sheet and a method for producing the same.

BACKGROUND ART

The use of a phosphor to convert the wavelength in a light-emitting diode (LED) is widely known in the field of LED device production (Patent Literature 1). In fact, much academic attention has been focused on a light-resistant silicone resin as a material for coating an LED device for encapsulation and protection (Patent Literature 2).

Generally, as for a white LED, a method for coating an LED chip with a silicone resin and an epoxy resin in which a phosphor is dispersed converts a blue light into a pseudo white light by dispersing the phosphor near the chip. However, a phosphor that is ununiformly dispersed or deviated in a resin layer can readily cause discoloration. Thus, in order to provide a phosphor with a uniform white light, the phosphor is required to uniformly be dispersed in a coated resin layer. Under the circumstances, a method for molding and curing a phosphor-containing silicone resin composition, processing it in the form of a film and gluing with an adhesive has attracted much technical attention. This method can fail to provide sufficient performance such as LED luminance due to light leakage and loss of light in an adhesive layer. In addition, a process for laminating a thermosetting silicone resin on an LED device essentially requires complicated production processes (Patent Literature 3).

A method for using a sheet-formed encapsulating material is associated with a difficulty of an LED having a wire pad to be bored on a bonding pad and to be laminated only in the form of a chip.

In LED device production, a resin layer for coating an LED device is required to have a high heat resistance and a high ultraviolet resistance. In a conventional LED production apparatus, it is advantageous to form a resin layer in which a phosphor is uniformly dispersed.

CITATION LIST

Patent Literature

PATENT LITERATURE 1: Japanese Unexamined Patent Application Publication 2005-524737
PATENT LITERATURE 2: Japanese Patent Laid-Open Publication No. 2004-339482
PATENT LITERATURE 3: Japanese Patent Laid-Open Publication No. 2009-094351

SUMMARY OF THE INVENTION

Technical Problem

The present invention was made to solve the problems mentioned above, and was intended to provide a phosphor-containing thermosetting silicone resin sheet having a phosphor-containing thermosetting silicone resin layer conforming to a surface shape of an LED device having no adhesive layer capable of uniformly dispersing a phosphor in an easy manner.

Solution to Problem

To solve the problems as mentioned above, the present invention provides a phosphor-containing thermosetting silicone resin sheet, comprising: a substrate film; and a phosphor-containing thermosetting silicone resin layer that is a plastic solid or a semi-solid at room temperature composed of a single layer having no adhesive layer, formed by printing and molding a phosphor-containing thermosetting silicone resin composition on the substrate film in the form of an LED device.

In addition, the present invention provides a phosphor-containing thermosetting silicone resin sheet, comprising: a substrate film; a phosphor-containing thermosetting silicone resin layer that is a plastic solid or a semi-solid at room temperature composed of a single layer having no adhesive layer, formed by printing and molding a phosphor-containing thermosetting silicone resin composition on the substrate film in the form of an LED device; and a cover film on the thermosetting silicone resin layer.

According to a phosphor-containing thermosetting silicone resin sheet obtained by forming a thermosetting silicone resin composition in the form of an LED device, the phosphor-containing thermosetting silicone resin layer can readily be laminated to the surface of the LED device without any adhesive, and the LED device can efficiently be encapsulated by thermally curing.

Accordingly, it is preferable that a thickness of the phosphor-containing thermosetting silicone resin layer formed on a substrate film be 20 to 200 μm.

A phosphor-containing thermosetting silicone resin layer having the above thickness is excellent in wavelength conversion and forming workability.

In this case, the phosphor-containing thermosetting silicone resin layer preferably comprises a thermosetting silicone resin composition, further comprising:

(A) a resin structure organopolysiloxane having an $R^1SiO_{1.5}$ unit, an $R^2{}_2SiO$ unit and an $R^3{}_aR^4{}_bSiO_{(4-a-b)/2}$ unit, wherein $R^1$, $R^2$ and $R^3$ each independently represent a methyl group, an ethyl group, a propyl group, a cyclohexyl group or a phenyl group, $R^4$ independently represents a vinyl group or an allyl group, "a" represents 0, 1 or 2, "b" represents 1 or 2, and a+b represents 2 or 3, and at least part of the $R^2{}_2SiO$ unit is in a continuous repeating sequence with 5 to 300 repeating units;

(B) a resin structure organohydrogen polysiloxane having an $R^1SiO_{1.5}$ unit, an $R^2{}_2SiO$ unit and an $R^3{}_cH_dSiO_{(4-c-d)/2}$ unit, wherein $R^1$, $R^2$ and $R^3$ each are independently the same as before, "c" represents 0, 1 or 2, "d" represents 1 or 2, and c+d represents 2 or 3, and at least part of the $R^2{}_2SiO$ unit is in a continuous repeating sequence with 5 to 300 repeating units, wherein the molar ratio of a hydrogen atom bonded to a silicon atom in the (B) component relative to the total of a vinyl group and an allyl group in the (A) component is 0.1 to 4.0;

(C) a platinum group metal-based catalyst, wherein the amount is a curing effective amount;

(D) a phosphor; and (E) an organic solvent.

Preferably, the above phosphor-containing thermosetting silicone resin layer is excellent in heat resistance and ultraviolet resistance and is capable of uniformly dispersing a phosphor.

Also in this case, the phosphor of the (D) component is preferably 0.1 to 300 parts by mass relative to 100 parts by mass totaling the (A) to (C) components.

Preferably, the phosphor is hard to produce precipitation that can cause deviation, a phosphor can readily be uniformly dispersed, and wavelength conversion can be favorably performed.

Furthermore, a particle diameter of the phosphor of the (D) component is preferably 10 nm or more.

Preferably, in the above phosphor-containing thermosetting silicone resin layer, the phosphor of the (D) component can be uniformly dispersed in an easier manner.

Moreover, the present invention provides a method for producing a phosphor-containing thermosetting silicone resin sheet, comprising:

a process for printing and molding the phosphor-containing thermosetting silicone resin composition on a substrate film in the form of an LED device to form a phosphor-containing thermosetting silicone resin layer; and a process for coating a cover film on the phosphor-containing thermosetting silicone resin layer.

By coating the cover film, the phosphor-containing thermosetting silicone resin layer can be protected, resulting in easier sheet carrying and handling and convenient ungluing in use.

Accordingly, the phosphor-containing thermosetting silicone resin layer is preferably formed by printing and molding a solvent-containing phosphor-containing thermosetting silicone resin composition on the substrate film in the form of an LED device and drying the solvent.

According to the method, by processing a phosphor-containing thermosetting silicone resin layer into a desired shape and drying a solvent, the layer is a plastic solid or a semi-solid at an uncured state, resulting in favorable sheet handling and workability. Thus, the phosphor-containing thermosetting silicone resin layer can be readily laminated and adhered to an LED device surface.

In addition, the present invention provides a method for producing a light-emitting apparatus, comprising encapsulating an LED device by curing, gluing and coating a phosphor-containing thermosetting silicone resin layer, by the processes of: laminating the phosphor-containing thermosetting silicone resin layer formed in the form of an LED device of the phosphor-containing thermosetting silicone resin sheet on the LED device surface; and thermally curing the phosphor-containing thermosetting silicone resin layer.

According to this method, a light-emitting apparatus having an LED device in which a phosphor-containing cure silicone resin layer conforms to a light-emitting portion of an LED device can readily be produced.

Also, the present invention provides a light-emitting apparatus, comprising an LED device encapsulated by curing, gluing and coating the phosphor-containing thermosetting silicone resin layer.

Advantageous Effects of Invention

According to the thermosetting silicone resin sheet of the present invention, the phosphor-containing thermosetting silicone resin layer can readily be laminated and adhered to an LED device surface due to easy sheet handling and favorable workability by processing the sheet that is a plastic solid or a semi-solid at an uncured state into a desired shape by using processing methods such as screen printing and ink jet and drying a solvent. In the plastic solid or semi-solid at an uncured state, the state of a filled phosphor dispersed is stable with time, no separation from a resin or precipitation therein is found during storage, and an effect of stably maintaining the thermosetting silicone resin layer in which a phosphor is uniformly dispersed is found.

The thermosetting silicone resin sheet of the present invention can readily be laminated and adhered to an LED device surface by using a mount device such as a conventional die bond mounter.

By curing the laminated phosphor-containing thermosetting silicone resin layer, the thermosetting silicone resin layer in which a phosphor is uniformly dispersed can be efficiently and stably formed in a uniform thick layer. In the phosphor resin layer obtained, the phosphor is uniformly dispersed, thereby generating rare discoloration and favorable color rendering property and thus an effect of obtaining a uniform white light.

DESCRIPTION OF EMBODIMENTS

In order to accomplish the above object, inventors of the present invention carried out an extensive investigation to find that by using a phosphor-containing thermosetting silicone resin sheet, comprising: a substrate film; and comprising a phosphor-containing thermosetting silicone resin layer that is a plastic solid or a semi-solid at room temperature composed of a single layer having no adhesive layer, formed by printing and molding a phosphor-containing thermosetting silicone resin composition on the substrate film in the form of an LED device, the phosphor-containing thermosetting silicone resin layer can readily be laminated and adhered to an LED device surface, and in the plastic solid or semi-solid at an uncured state, the state of a filled phosphor dispersed is stable with time, no separation from a resin or precipitation therein is found during storage, and an effect of stably maintaining the resin layer in which a phosphor is uniformly dispersed is found.

Herein, "room temperature" means an ambient temperature at a normal state, usually 15 to 30° C., typically 25° C. "Semi-solid" means the state of a substance having plasticity whose specific molded shape is maintained at least 1 hour, preferably 8 hours or more. Thus, despite essential fluidity in a substance having a very high of viscosity at room temperature, the substance is semi-solid due to no visual confirmation of change in shape (i.e. collapse) for a short period of time such as at least 1 hour from the very high of viscosity. Since the phosphor-containing thermosetting silicone resin layer is a solid or a semi-solid at room temperature, its handling property is favorable and workability is high.

The phosphor-containing thermosetting silicone resin layer is a plastic solid or a semi-solid at room temperature and first starts softening and then curing by heating. Specifically, the state of a solid exhibits a slight fluidity and the state of a semi-solid represents more fluidity. Thereafter, the viscosity will increase again and the phosphor-containing thermosetting silicone resin layer will be solider.

Figure 1:
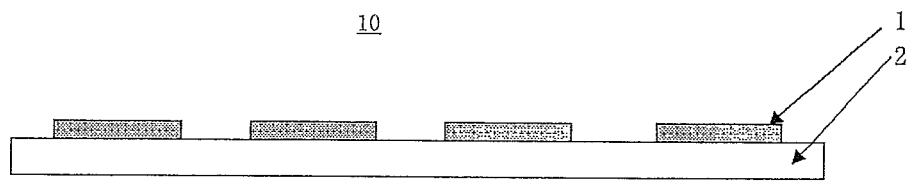
FIG. 1 is a sectional view showing the structure of the thermosetting silicone resin sheet of the present invention.

As shown in FIG. 1, a phosphor-containing thermosetting silicone resin sheet 10 of the present invention comprises a substrate film 2 and a phosphor-containing thermosetting silicone resin layer 1 that is plastic a solid or a semi-solid at room temperature composed of a single layer having no adhesive layer, formed by printing and molding a phosphor-containing thermosetting silicone resin composition on the substrate film 2 in the form of an LED device.

Figure 2:
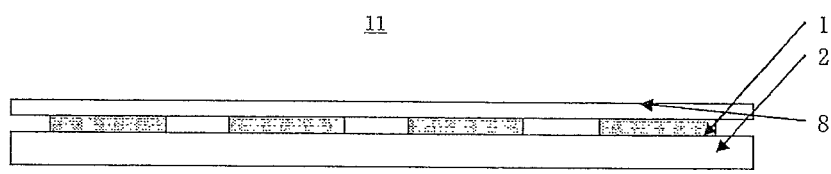
FIG. 2 is another sectional view showing the structure of the thermosetting silicone resin sheet of the present invention.

As shown in FIG. 2, as another example, a phosphor-containing thermosetting silicone resin sheet 11 of the present invention comprises: a substrate film 2; a phosphor-containing thermosetting silicone resin layer 1 that is a plastic solid or a semi-solid at room temperature composed of a single layer having no adhesive layer, formed by printing and molding a phosphor-containing thermosetting silicone resin composition on the substrate film 2 in the form of an LED device; and a cover film 8 on the thermosetting silicone resin layer.

The thickness of the phosphor-containing thermosetting silicone resin layer 1 formed on the substrate film 2 is normally 10 to 200 μm, preferably 20 to 100 μm, and more preferably 30 to 80 μm in view of a favorable wavelength conversion. The thickness is preferably determined in consideration of particle diameter and dispersion concentration of a phosphor as well. If the amount of a phosphor is appropriate, a white light can be more readily obtained in a blue LED. An appropriate thickness of a phosphor is preferable in terms of forming operation so that the phosphor is uniformly dispersed.

The present invention will be described in more detail.

The thermosetting silicone resin composition present in a phosphor-containing thermosetting silicone resin layer as a vital component of the phosphor-containing thermosetting silicone resin sheet of the present invention is not particularly restricted if it is a thermosetting silicone resin composition, but the following (A) to (E) components are preferably contained.

—(A) Resin Structure Alkenyl Group-Containing Organopolysiloxane—

A resin structure (i.e. 3-dimensional network structure) organopolysiloxane as (A) component of a thermosetting silicone resin composition has an $R^1SiO_{1.5}$ unit, an $R^2_2SiO$ unit and an $R^3_aR^4_bSiO_{(4-a-b)/2}$ unit, wherein $R^1$, $R^2$ and $R^3$ each represent a methyl group, an ethyl group, a propyl group, a cyclohexyl group or a phenyl group, $R^4$ represents a vinyl group or an allyl group, "a" represents 0, 1 or 2, "b" represents 1 or 2, and a+b represents 2 or 3, and at least part of the $R^2_2SiO$ unit is in a continuous repeating sequence with 5 to 300 repeating units, preferably 10 to 300 repeating units, more preferably 15 to 200 repeating units, and much more preferably 20 to 100 repeating units.

The structure in which at least part of the $R^2_2SiO$ unit is in a continuous repeating sequence with 5 to 300 repeating units means a linear diorganopolysiloxane chain structure represented by the general formula (1):

wherein "m" represents an integer of 5 to 300.

At least part of the entire $R^2_2SiO$ unit present in the organopolysiloxane of the (A) component, preferably 50 mole % or more (50 to 100 mole %), particularly 80 mole % or more (80 to 100 mole %) preferably forms a chain structure represented by the general formula (1) in one molecule.

The $R^2_2SiO$ unit serves to linearly elongate a polymer molecule in one molecule of the (A) component, and the $R^1SiO_{1.5}$ unit subjects a polymer molecule to a branched or a 3-dimensional networked structure. The $R^4$ (a vinyl group or an allyl group) in the $R^3_aR^4_bSiO_{(4-a-b)/2}$ unit cures the composition of the present invention by hydrosilylation addition reaction with a hydrogen atom (i.e. an SiH group) bonded to a silicon atom of an $R^3_cH_dSiO_{(4-c-d)/2}$ unit present in the later-mentioned (B) component.

The molar ratio of 3 required siloxane units comprising the (A) component, or the molar ratio of an $R^1SiO_{1.5}$ unit:$R^2_2SiO$ unit:$R^3_aR^4_bSiO_{(4-a-b)/2}$ unit is preferably 90 to 24:75 to 9:50 to 1, particularly 70 to 28:70 to 20:10 to 2 (the total is 100) in view of characteristics of a cured product obtained.

The $R^3_aR^4_bSiO_{(4-a-b)/2}$ unit present in the organopolysiloxane is preferably 0.001 mol/100 g or more as the total of a vinyl group and an allyl group, more preferably 0.025 mol/100 g or more, and much more preferably 0.03 to 0.3 mol/100 g.

The weight average molecular weight of the (A) component converted into polystyrene by gel-permeation chromatography (GPC) is preferably 3,000 to 1,000,000, particularly 10,000 to 100,000 in view of workability and curing property as a solid or a semi-solid polymer.

The resin structure organopolysiloxane can be synthesized by determining a combination of each compound as a raw material of each unit so that the above three types of siloxane units are combined with a desired molar ratio in a produced polymer and then performing co-hydrolysis and condensation in the presence of an acid.

In a composition used in the following descriptions, Me represents a methyl group, Et represents an ethyl group, Ph represents a phenyl group, and Vi represents a vinyl group.

Illustrative example of the $R^1SiO_{1.5}$ unit's raw material includes a $MeSiCl_3$, an $EtSiCl_3$, a $PhSiCl_3$, chlorosilanes such as a propyltrichlorosilane and a cyclohexyltrichlorosilane and alkoxysilanes such as a methoxysilane corresponding to each of these chlorosilanes.

Illustrative example of the raw material of the $R^1_2SiO$ unit includes
$ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$,
$HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$,
$MeOMe_2SiO(Me_2SiO)_m(Ph_2SiO)_nSiMe_2OMe$, wherein "m" represents an integer of 5 to 150 (average), and "n" represents an integer of 5 to 300 (average).

The $R^3{}_aR^4{}_bSiO_{(4-a-b)/2}$ unit represents one type of siloxane unit or 2 or a combination of 2 or more types thereof selected from the group consisting of an $R^3R^4SiO$ unit, an $R^3{}_2R^4SiO_{0.5}$ unit, an $R^4{}_2SiO$ unit and an $R^3R^4{}_2SiO_{0.5}$ unit. Illustrative example of the raw material includes chlorosilanes such as a $Me_2ViSiCl$, a $MeViSiCl_2$, a $Ph_2ViSiCl$ and a $PhViSiCl_2$, and alkoxysilanes such as a methoxysilane corresponding to each of these chlorosilanes.

In the present invention, in the organopolysiloxane of the (A) component, 90 mole % or more (90 to 100 mole %) of a siloxane unit comprising the (A) component, particularly 95 mole % or more (95 to 100 mole %) may be made of 3 types of siloxane units: an $R^1SiO_{1.5}$ unit, an $R^2{}_2SiO$ unit and an $R^3{}_aR^4{}_bSiO_{(4-a-b)/2}$ unit, and 0 to 10 mole % thereof, particularly 0 to 5 mole % may be made of other types of siloxane units. Specifically, when the organopolysiloxane of the (A) component is produced by co-hydrolysis and condensation of the above compound as a raw material, a siloxane unit having a silanol group can be produced as a by-product other than an $R^1SiO_{1.5}$ unit, an $R^2{}_2SiO$ unit and/or an $R^3{}_aR^4{}_bSiO_{(4-a-b)/2}$ unit. The organopolysiloxane of the (A) component may normally contain 10 mole % or less (0 to 10 mole %) of the siloxane unit containing silanol groups, preferably about 5 mole % or less (0 to 5 mole %) relative to all the siloxane unit illustrative example of the above siloxane unit containing silanol groups includes an $R^1$ (HO)SiO unit, an $R^1$ (HO)$_2$ SiO$_{0.5}$ unit, an $R^2{}_2$(HO)SiO$_{0.5}$ unit, an $R^3{}_aR^4{}_b$(HO) SiO$_{(3-a-b)/2}$ unit and an $R^3{}_aR^4{}_b$(HO)$_2$SiO$_{(2-a-b)/2}$ unit, wherein $R^1$ to $R^4$ and a and b are the same as before.

—(B) Resin Structure Organohydrogen Polysiloxane—

A resin structure organohydrogen polysiloxane (i.e. 3-dimensional network structure) as (B) component of the thermosetting silicone resin composition has an $R^1SiO_{1.5}$ unit, an $R^2{}_2SiO$ unit and an $R^3{}_cH_dSiO_{(4-c-d)/2}$ unit, wherein $R^1$, $R^2$ and $R^3$ are the same as before, "c" represents 0, 1 or 2, "d" represents 1 or 2, and c+d represents 2 or 3, and contains a linear siloxane structure, wherein at least part of the $R^2{}_2SiO$ unit is in a continuous repeating sequence with 5 to 300 repeating units, preferably 10 to 300 repeating units, more preferably 15 to 200 repeating units, much more preferably 20 to 100 repeating units.

The structure in which at least part of an $R^2{}_2SiO$ unit is in a continuous repeating sequence with 5 to 300 repeating units means at least part of the $R^2{}_2SiO$ unit present in the (B) component, preferably 50 mole % or more (50 to 100 mole %), particularly 80 mole % or more (80 to 100 mole %) forms a linear diorganopolysiloxane chain structure represented by the general formula (1) in one molecule of the (B) component, as above mentioned with regard to the (A) component.

The $R^2{}_2SiO$ unit serves to linearly elongate a polymer molecule in one molecule of the (B) component as well, and the $R^1SiO_{1.5}$ unit subjects the polymer molecule to a branched or a 3-dimensional networked structure. A hydrogen atom bonded to a silicon atom in an $R^3{}_cH_dSiO_{(4-c-d)/2}$ unit cures the composition of the present invention by hydrosilylation addition reaction with an alkenyl group present in the (A) component.

The molar ratio of 3 required types of siloxane units: an $R^1SiO_{1.5}$ unit: an $R^2{}_2SiO$ unit: an $R^3{}_cH_dSiO_{(4-c-d)/2}$ unit comprising the (B) component is preferably 90 to 24:75 to 9:50 to 1, particularly 70 to 28:70 to 20:10 to 2 (the total is 100) in view of a characteristic of a cured product obtained.

The weight average molecular weight of the (B) component converted into polystyrene by GPC is preferably 3,000 to 1,000,000, particularly 10,000 to 100,000 in view of workability and a characteristic of a cured product.

The resin structure organopolysiloxane can be synthesized by determining a combination of each compound as a raw material of each unit so that the 3 types of siloxane units are combined with a desired molar ratio in a produced polymer and then performing co-hydrolysis and condensation.

Illustrative example of the $R^1SiO_{1.5}$ unit's raw material includes a $MeSiCl_3$, an $EtSiCl_3$, a $PhSiCl_3$, a chlorosilane such as a propyltrichlorosilane and a cyclohexyltrichlorosilane and an alkoxysilane such as a methoxysilane corresponding to each of these chlorosilanes.

Illustrative example of the raw material of the $R^1{}_2SiO$ unit includes $ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$,
$HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$,
$MeOMe_2SiO(Me_2SiO)_m(Ph_2SiO)_nSiMe_2OMe$,
wherein "m" represents an integer of 5 to 150 (average), and "n" represents an integer of 5 to 300 (average).

The $R^3{}_cH_dSiO_{(4-c-d)/2}$ unit represents one type of siloxane unit or a combination of 2 or more types selected from the group consisting of an $R^3HSiO$ unit, an $R^3{}_2HSiO_{0.5}$ unit, an $H_2SiO$ unit and an $R^3H_2SiO_{0.5}$ unit. Illustrative example of the raw material includes a chlorosilane such as a $Me_2HSiCl$, a $MeHSiCl_2$, a $Ph_2HSiCl$ and a $PhHSiCl_2$, and an alkoxysilane such as a methoxysilane corresponding to each of these chlorosilanes.

In the present invention, in the organohydrogen polysiloxane of the (B) component, 90 mole % or more (90 to 100 mole %) of a siloxane unit comprising the (B) component, particularly 95 mole % or more (95 to 100 mole %) may be made of 3 types of siloxane units: an $R^1SiO_{1.5}$ unit, an $R^2{}_2SiO$ unit and an $R^3{}_cH_dSiO_{(4-c-d)/2}$ unit, and 0 to 10 mole %, particularly 0 to 5 mole % may be made of other types of siloxane units. Specifically, when the organopolysiloxane of the (B) component is produced by co-hydrolysis and condensation of the above compound as a raw material, a siloxane unit having a silanol group can be produced as a by-product other than an $R^1SiO_{1.5}$ unit, an $R^2{}_2SiO$ unit and an $R^3{}_cH_dSiO_{(4-c-d)/2}$ unit. The organopolysiloxane of the (B) component may normally contain 10 mole % or less (0 to 10 mole %) of the silanol group-containing siloxane unit, preferably about 5 mole % or less (0 to 5 mole %) relative to all the siloxane unit. Illustrative example of the above siloxane unit containing silanol groups includes an $R^1$(HO)SiO unit, an $R^1$(HO)$_2$SiO$_{0.5}$ unit, an $R^2{}_2$ (HO)SiO$_{0.5}$ unit, an $R^3{}_cH_d$(HO)SiO$_{(3-c-d)/2}$ unit and an $R^3{}_cH_d$(HO)$_2$SiO$_{(2-c-d)/2}$ unit, wherein $R^1$ to $R^3$ and c and d are the same as before.

The amount of the organohydrogen polysiloxane of the (B) component to be blended is determined so that the molar ratio of a hydrogen atom (an SiH group) bonded to a silicon atom in the (B) component relative to the total of a vinyl group and an allyl group in the (A) component is preferably 0.1 to 4.0, more preferably 0.5 to 3.0, and much more preferably 0.8 to 2.0. If the molar ratio is 0.1 or more, the curing reaction proceeds, thereby making it possible to obtain a silicone cured product by curing reaction. If the molar ratio is under 4.0, an unreacted SiH group does not remain in the cured product in large quantities and thus physical properties of the cured product of the silicone resin composition cannot change with time.

—(C) Platinum Group Metal-Based Catalyst—

The catalyst component is a platinum-based, a palladium-based or a rhodium-based catalyst which is blended so as to promote a curing addition reaction of the thermosetting silicone resin composition. Illustrative example thereof includes a platinum-based catalyst such as a platinum, a platinum black and a chloroplatinic acid, e.g. an $H_2PtCl_6 \cdot mH_2O$, $K_2PtCl_6$, $KHPtCl_6 \cdot mH_2O$, $K_2PtCl_4$, $K_2PtCl_4 \cdot mH_2O$, $PtO_2 \cdot mH_2O$ ("m" represents a positive integer), a complex of these substances and a hydrocarbon such as an olefin, an alcohol or a vinyl group-containing organopolysiloxane in view of cost performance. These catalysts can be used alone or in combination of two or more types thereof.

The amount of the (C) component to be blended may be an curing effective amount, normally in the range of 0.1 to 500 ppm, and more preferably 0.5 to 100 ppm converted into mass as a platinum group metal relative to the total of the (A) and (B) components.

—(D) Phosphor—

The phosphor of (D) component may be any phosphor if it is a known phosphor, and the amount to be blended is preferably 0.1 to 300 parts by mass, more preferably 10 to 300 relative to 100 parts by mass totaling (A) to (C) components of a thermosetting silicone resin composition comprising a phosphor-containing thermosetting silicone resin layer. The average particle diameter of the phosphor of the (D) component can be calculated as mass average $D_{50}$ (or median diameter) in particle size distribution measurement by laser diffraction method. The average particle diameter may normally be 10 nm or more, preferably 10 nm to 10 μm, and more preferably 10 nm to 1 μm.

A luminescent substance may be any substance if it absorbs a light from a semiconductor light-emitting diode with a nitride-based semiconductor as a luminous layer and converts the wavelength into a different wavelength. Preferable example thereof includes at least one type selected from the group consisting of a nitride-based phosphor and an oxynitride-based phosphor mainly activated by lanthanoids such as Eu and Ce, an alkaline earth metal halogen apatite phosphor, an alkaline earth metal halogen borate phosphor, an alkaline earth metal aluminate phosphor, an alkaline earth metal silicate phosphor, an alkaline earth metal sulfide phosphor, an alkaline earth metal thiogallate phosphor, an alkaline earth metal silicon nitride phosphor, a germanate phosphor mainly activated by a lanthanoid element such as Eu and a transition metal element such as Mn, or a rare earth aluminate phosphor and a rare earth silicate phosphor mainly activated by a lanthanoid element such as Ce or organic and organic complex phosphor, a Ca—Al—SiO—N-based oxynitride glass phosphor mainly activated by a lanthanoid element such as Eu. Illustrative example thereof includes the following phosphors, but not restricted thereto. M is at least one type of element selected from the group consisting of Sr, Ca, Ba, Mg and Zn, X is at least one type of element selected from the group consisting of F, Cl, Br and I, and R is Eu, Mn, or a combination of Eu and Mn.

Illustrative example of the nitride-based phosphor mainly activated by a lanthanoid element such as Eu and Ce includes an $M_2Si_5N_8$: Eu, an $MSi_7N_{10}$: Eu, an $M_{1.8}Si_5O_{0.2}N_8$: Eu and an $M_{0.9}Si_7O_{0.1}N_{10}$: Eu.

Illustrative example of the oxynitride-based phosphor mainly activated by a lanthanoid element such as Eu and Ce includes an $MSi_2O_2N_2$: Eu.

Illustrative example of the alkaline earth metal halogen apatite phosphor mainly activated by a lanthanoid element such as Eu or a transition metal element such as Mn includes an $M_5(PO_4)_3X$: R.

Illustrative example of the alkaline earth metal halogen borate phosphor includes an $M_2B_5O_9X$: R (M is at least one type selected from the group consisting of Sr, Ca, Ba, Mg and Zn. X is at least one type selected from the group consisting of F, Cl, Br and I. Illustrative example of the R includes 1 or more of Eu, Mn, a combination of Eu and Mn).

Illustrative example of the alkaline earth metal aluminate phosphor includes a $SrAl_2O_4$: R, a $Sr_4Al_{14}O_{25}$: R, a $CaAl_2O_4$: R, a $BaMg_2Al_{16}O_{27}$: R, a $BaMg_2Al_{16}O_{12}$: R and a $BaMgAl_{10}O_{17}$: R (R is one or more types of Eu, Mn, a combination of Eu and Mn).

Illustrative example of the alkaline earth metal sulfide phosphor includes a $La_2O_2S$: Eu, $Y_2O_2S$: Eu, and a $Gd_2O_2S$: Eu.

Illustrative example of the rare earth aluminate phosphor mainly activated by a lanthanoid element such as Ce includes a YAG-based phosphor represented by a composition formula such as a $Y_3Al_5O_{12}$: Ce, a $(Y_{0.8}Gd_{0.2})_3Al_5O_{12}$: Ce, a $Y_3(Al_{0.8}Ga_{0.2})_5O_{12}$: Ce and a $(Y,Gd)_3(Al,Ga)_5O_{12}$, and $Tb_3Al_5O_{12}$: Ce and $Lu_3Al_5O_{12}$: Ce obtained by substituting part or all of Y with Tb, Lu and so on.

Illustrative example of other phosphors includes a ZnS: Eu and a $Zn_2GeO_4$: $MnMGa_2S_4$: Eu.

The above phosphor can contain, as required, one or more types selected from the group consisting of Tb, Cu, Ag, Au, Cr, Nd, Dy, Co, Ni and Ti, instead of or in addition to Eu.

The Ca—Al—SiO-N-based oxynitride glass phosphor is a phosphor obtained by defining an oxynitride glass having 100 mole % totaling 5 components: $CaCO_3$ (20 to 50 mole % converted into CaO), $Al_2O_3$ (0 to 30 mole %), SiO (25 to 60 mole %), AlN (5 to 50 mole %) and a rare earth oxide or a transition metal oxide (0.1 to 20 mole %) as a matrix material. In the phosphor with an oxynitride glass as a matrix material, the nitrogen content is preferably 15% by mass or less. Another rare earth element ion (as a sensitizer) is preferably contained in a phosphor glass in the range of 0.1 to 10 mole % as a rare earth oxide and a co-activator, in addition to a rare earth oxide ion.

A phosphor other than the above phosphor having similar performance and effects can be used.

—(E) Organic Solvent—

An organic solvent is a component required for uniformly dissolving the (A) to (D) components and enabling printing, and is not particularly restricted if it can dissolve the (A) to (C) components. The boiling point is preferably 80° C. to 200° C. in view of drying property and the amount to be added is preferably 1 to 50% by mass relative to the total of the (A) to (D) components. Illustrative example of the solvent includes toluene, xylene, n-heptane, cyclohexanone, diglyme and a silicone-based solvent such as hexamethyldisiloxane.

—Other Compounding Agent—

Each of known additives, other than the above-described components, can be blended into the thermosetting silicone resin composition as required.

Inorganic Filler:

An inorganic filler may be added to reduce coefficient of thermal expansion. Illustrative example of the inorganic filler includes a reinforcing inorganic filler such as a fumed silica, a fumed titanium dioxide and a fumed alumina and a non-reinforcing inorganic filler such as a fused silica, an alumina, a calcium carbonate, a calcium silicate, a titanium dioxide, a ferric oxide and a zinc oxide. These inorganic filler can be blended in the range of 100 parts by mass or less (0 to 100 parts by mass) per 100 parts by mass totaling the (A) and (B) components.

Adhesion Additives:

An adhesion additives can be added to a thermosetting silicone resin composition in order to impart adhesion property, as required. Illustrative example of the adhesion additives includes a linear or cyclic organosiloxane oligomer containing 4 to 50 silicon atoms, preferably 4 to 20, further containing at least 2 types of functional groups selected from the group consisting of e.g. a hydrogen atom bonded to a silicon atom in one molecule (an SiH group), an alkenyl group bonded to a silicon atom (e.g. an Si—CH=CH$_2$ group), an alkoxysilyl group (e.g. a trimethoxysilyl group), an epoxy group (e.g. a glycidoxypropyl group and a 3,4-epoxycyclohexylethyl group), preferably 2 or 3 types thereof, an organooxysilyl-modified isocyanurate compound and/or a hydrolytic condensate thereof (organosiloxane-modified isocyanurate compound) represented by the following general formula (2).

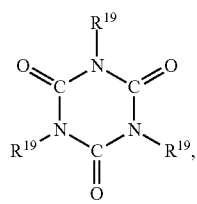
(2)

wherein $R^{19}$ represents an organic group represented by the following formula (3), or a monovalent hydrocarbon group containing an aliphatic unsaturated bond, and $R^{19}$ represents an organic group represented by the general formula (3) in at least one thereof.

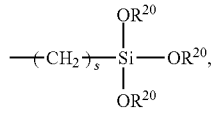
(3)

wherein $R^{20}$ represents a hydrogen atom or a monovalent hydrocarbon group having 1 to 6 carbon atoms, and s is an integer of 1 to 6, particularly 1 to 4.

Illustrative example of the monovalent hydrocarbon group containing an aliphatic unsaturated bond of the $R^{19}$ in the general formula (2) includes an alkenyl group having 2 to 8 carbon atoms, particularly an alkenyl group having 2 to 6 carbon atoms such as a vinyl group, an allyl group, a propenyl group, an isopropenyl group, a butenyl group, an isobutenyl group, a pentenyl group and a hexenyl group and a cycloalkenyl group having 6 to 8 carbon atoms such as a cyclohexenyl group. Illustrative example of the monovalent hydrocarbon group of the $R^{20}$ in the general formula (3) includes a monovalent hydrocarbon group having 1 to 8 carbon atoms, particularly a monovalent hydrocarbon group 1 to 6 carbon atoms such as an alkyl group such as a methyl group, an ethyl group, a propyl group, an isopropyl group, a butyl group, an isobutyl group, a tert-butyl group, a pentyl group, a hexyl group and a cyclohexyl group, an alkenyl group shown in the above $R^{19}$ and a cycloalkenyl group, and an allyl group such as a phenyl group, preferably an alkyl group.

Illustrative example of the adhesion auxiliary includes a 1,5-glycidoxypropyl-1,3,5,7-tetramethylcyclotetrasiloxane, a 1-glycidoxypropyl-5-trimethoxysilylethyl-1,3,5,7-tetramethylcyclotetrasiloxane, and a compound represented by the following formula.

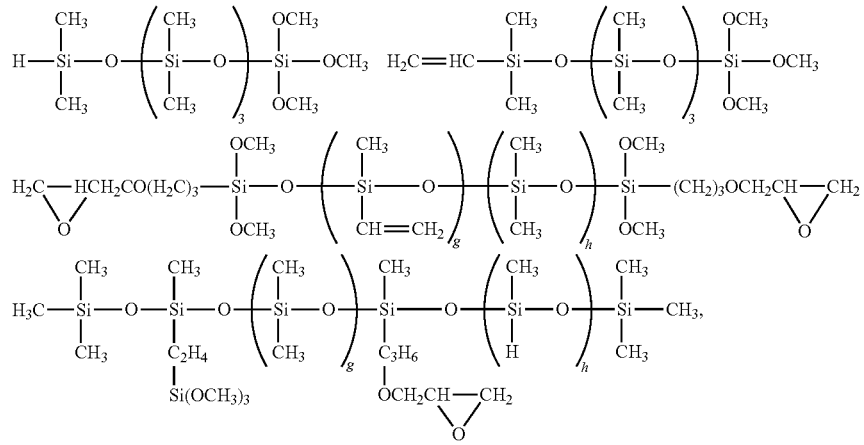

wherein g and h each are an integer of 0 to 50, and g+h is 2 to 50, preferably 4 to 20.

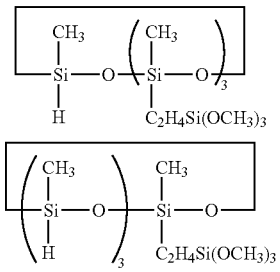

-continued

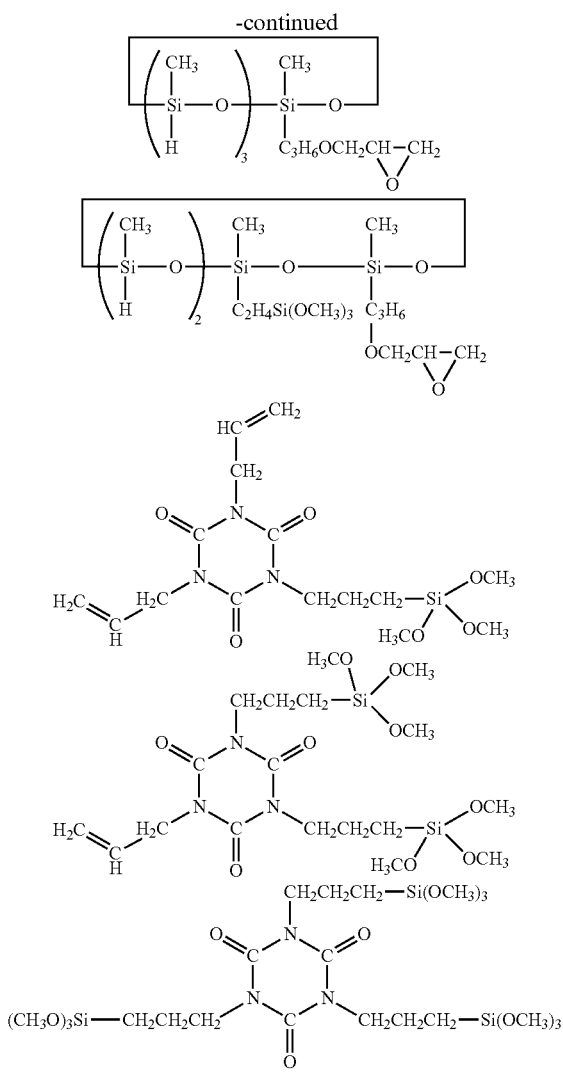

Illustrative example of the above organosilicon compound that provides a cured product obtained with a particularly favorable adhesion property includes an organosilicon compound having an alkoxy group bonded to a silicon atom and an alkenyl group or a hydrogen atom bonded to a silicon atom (an SiH group) in one molecule.

The amount of the adhesion additives to be blended is normally 10 parts by mass or less (0 to 10 parts by mass), preferably 0.1 to 8 parts by mass, more preferably 0.2 to 5 parts by mass, relative to 100 parts by mass of the (A) component. If the amount is 10 parts by mass or less, the hardness of a cured product is not adversely affected and surface tackiness is not expected to increase.

As needed, a liquid silicone component can be added so that a phosphor-containing thermosetting silicone resin layer can be maintained at a solid or a semi-solid (non-liquid state) at room temperature. Such a liquid silicone component preferably has a viscosity of 1 to 100,000 mPa·s at room temperature (25° C.), e.g. vinylsiloxanes, hydrogensiloxanes, alkoxysiloxanes, hydroxysiloxanes and a mixture thereof. The amount thereof to be added is normally 50% by mass or less relative to the entire phosphor-containing thermosetting silicone resin layer on condition that the phosphor-containing thermosetting silicone resin layer is maintained at a solid or a semi-solid at room temperature.

Reaction Inhibitor:

A reaction inhibitor can be blended into a thermosetting silicone resin composition as required. The reaction inhibitor is added in order to reduce curing reaction by hydrosilylation and improve preservation. Illustrative example of the reaction inhibitor includes a compound selected from the group consisting of a vinyl group highly containing organopolysiloxane such as a tetramethyltetravinylcyclotetrasiloxane, a triallyl isocyanurate, an alkylmaleate, an acetylene alcohol and a silane-modified product thereof and a siloxane-modified product, a hydroperoxide, a tetramethylethylenediamine, a benzotriazole and a mixture thereof. The reaction inhibitor is added at 0.001 to 1.0 parts by mass, preferably 0.005 to 0.5 parts by mass per 100 parts by mass of the (A) component.

Typical illustrative example of the phosphor-containing thermosetting silicone resin sheet of the present invention includes a sheet obtained by molding a phosphor-containing silicone resin layer having a thermosetting silicone resin composition containing the (A) to (E) components in the form of an LED device on a substrate film.

—Preparation and Curing Conditions—

In the thermosetting silicone resin composition used in producing the phosphor-containing thermosetting silicone resin sheet of the present invention, the (A) to (E) components and an optional component to be blended as required is uniformly mixed to prepare a phosphor-containing product. Normally, the product is stored as two separate liquids so that they are not cured, and the two liquids are mixed in use for a subsequent process. Obviously, a reaction inhibitor such as the above mentioned acetylene alcohol can be added in small quantities to be used as one liquid.

<Method for Producing a Phosphor-Containing Thermosetting Silicone Resin Sheet>

The phosphor-containing thermosetting silicone resin sheet of the present invention is produced by, e.g. as shown in FIG. 2, printing a phosphor-containing thermosetting silicone resin composition in the form of an LED device on a substrate film 2 by using a screen printer or an ink jet printer, drying a solvent to form a phosphor-containing thermosetting silicone resin layer 1 and coating a cover film 8 on the phosphor-containing thermosetting silicone resin layer 1 to be processed into a sheet. The thicknesses of the substrate film 2 and the cover film 8 are selected according to the thickness of the silicone resin layer 1, but the thickness of the silicone resin sheet is 20 to 400 μm, preferably 20 to 300 μm.

The phosphor-containing thermosetting silicone resin sheet is normally preserved by freezing.

<Method for Producing Light-Emitting Apparatus or Light-Emitting Apparatus>

In order to obtain or produce a light-emitting apparatus of the present invention, an LED device is encapsulated by a method shown below by using a phosphor-containing thermosetting silicone resin sheet obtained above.

Figure 3:
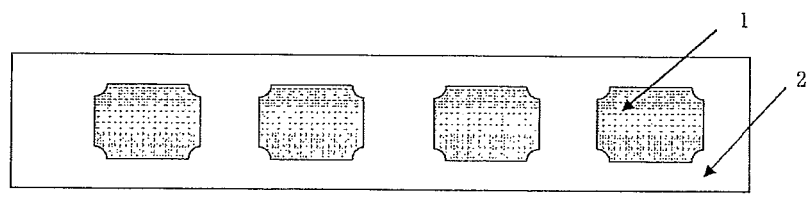
FIG. 3 is a plan view of the thermosetting silicone resin sheet of the present invention by printing and molding a phosphor-containing thermosetting silicone resin composition on a substrate film in the form of an LED device to form a phosphor-containing thermosetting silicone resin layer.
Figure 4:
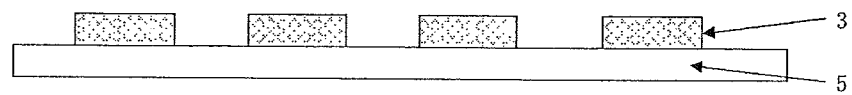
FIG. 4 is a side view showing an LED device is bonded on a ceramics substrate.
Figure 5:
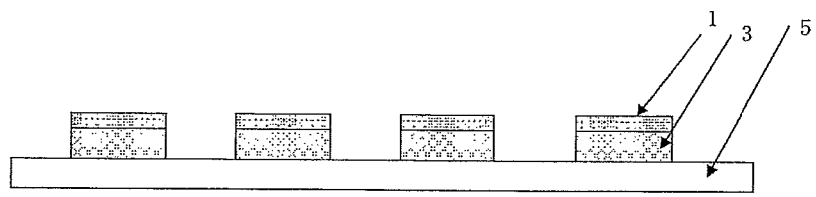
FIG. 5 is a side view showing a phosphor-containing thermosetting silicone resin layer is laminated on an LED device on a ceramics substrate.
Figure 6:
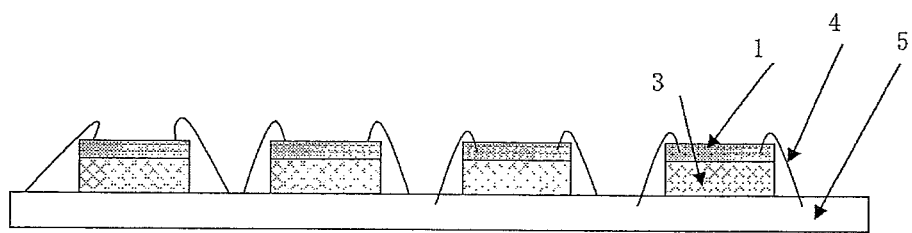
FIG. 6 is a side view showing an external connecting terminal and an LED device are connected by using a gold wire, after bonding the LED device on a ceramics substrate with a resin die bond material.

As shown in FIG. 3, the phosphor-containing thermosetting silicone resin layer 1 on the substrate film 2 is laminated on a LED device 3 bonded with a resin die bond material, as shown in FIGS. 4 and 5, on a ceramics substrate 5. The phosphor-containing thermosetting silicone resin 1 is thermally cured, softened in a curing process and solidified with a thickening viscosity. Thus, even the phosphor-containing thermosetting silicone resin 1 is laminated on a gold wire 4 shown in FIG. 6, an LED device 3 can be encapsulated with no damage to the gold wire 4. Normally, a substrate mounting a plurality of LEDs encapsulated in this method is coated with a silicone resin layer, encapsulated by curing, and diced to give independent pieces. Use of an LED device whose external terminal is connected with a gold bump, not with a gold wire, can encapsulate an LED device. Accordingly, the LED device converts a wavelength of a light emitted from the LED device 3 into a desired wavelength to coat, protect and encapsulate the LED device 3.

Figure 7:
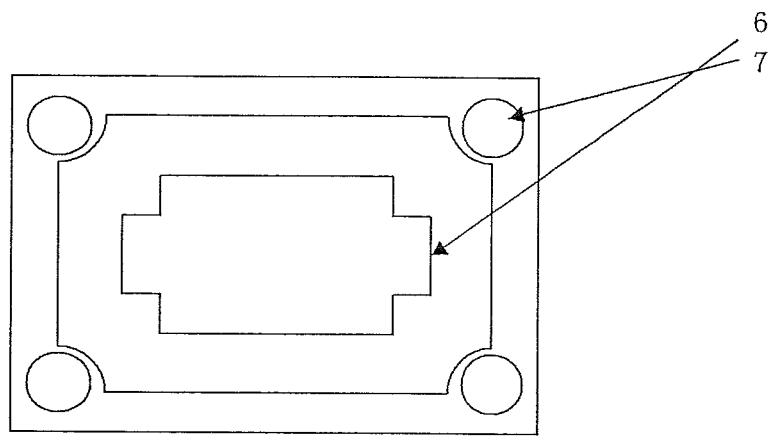
FIG. 7 is a figure of electrode of an LED device.

By using the phosphor-containing thermosetting silicone resin sheet of the present invention, as shown in FIG. 7, an LED device in which a gold electrode 6 and an outer lead 7 are formed can be produced.

The cured phosphor-containing thermosetting silicone resin layer can form a flexible cured product having no high hardness or surface tackiness, produces no discoloration in blue light emitted from an LED, and convert blue light into a uniform white light.

When a substrate and an LED device are bonded by a face-up system, a phosphor-containing silicone resin layer is laminated on an LED device beforehand. After an outer lead is bonded with a gold bump after curing, a silica-containing silicone resin and an epoxy resin are injected to be cured to protect the bump and the LED device.

The phosphor-containing thermosetting silicone resin layer can normally be pressure bonded on an LED device with a pressure of 10 MPa or less (normally 0.01 to 10 MPa) at room temperature to 300° C., preferably 5 MPa or less (e.g. 0.1 to 5 MPa), particularly 0.5 to 5 MPa.

Since the phosphor-containing thermosetting silicone resin layer is made of a silicone resin at A stage (unreactive) described above, it readily is softened at the above temperature and then solidified. Therefore, the phosphor-containing thermosetting silicone resin layer can encapsulate an LED device without changing the thickness by conforming to uneven surface of an electrode.

If the viscosity on heating is too low at A stage (unreactive), the phosphor-containing thermosetting silicone resin layer can be subjected to further reaction at an ambient temperature of 50 to 100° C. by allowing it to stand until the viscosity becomes a desired value. This process can arbitrarily be selected in the present invention.

"Softening temperature" of the phosphor-containing thermosetting silicone resin layer means the temperature at which a resin is softened, and in the present invention, the temperature measured by a penetration method (method for measuring the softening temperature from the extent of a needle to be inserted into a resin and deformation of a sample), by using a thermo mechanical analysis TMA device (Product from SII: TMA/SS6100). The softening temperature of the phosphor-containing thermosetting silicone resin layer is normally 35 to 100° C., preferably 40 to 80° C.

The phosphor-containing thermosetting silicone resin layer is cured at normally 50 to 200° C., particularly 70 to 180° C. for 1 to 30 minutes, particularly 2 to 10 minutes. The silicone resin layer can be subjected to post cure at 50 to 200° C., particularly 70 to 180° C. for 0.1 to 10 hours, particularly 1 to 4 hours.

EXAMPLES

The present invention will be described in more detail with reference to Synthetic Examples, Preparation Examples, Examples and Comparative Examples. The viscosity in the following examples is defined at 25° C. The weight average molecular weight is the value converted into polystyrene measured by gel-permeation chromatography (GPC).

Synthetic Example 1

Organopolysiloxane Resin Containing Vinyl Group (A1)

After organosilane represented by $PhSiCl_3$ (27 mol) and $ClMe_2SiO(Me_2SiO)_{33}SiMe_2Cl$ (1 mol) and $MeViSiCl_2$ (3 mol) were dissolved into a toluene solvent, added dropwise into water, subjected to co-hydrolysis, washed with water and alkaline for neutralization and dehydrated, the solvent was stripped to synthesize a resin containing a vinyl group (A1). In the resin, the composition ratio of a constituent siloxane unit and the structure represented by [—$SiMe_2$O-($Me_2SiO)_{33}$—$SiMe_2O_{2/2}$] is represented by the formula: $[PhSiO_{3/2}]_{0.27}$ $[-SiMe_2O-(Me_2SiO)_{33}-SiMe_2O_{2/2}]_{0.01}[MeViSiO_{2/2}]_{0.03}$. The weight average molecular weight of the resin was 62,000, and the boiling point was 60° C.

Synthetic Example 2

Organopolysiloxane Resin Containing Hydrosilyl Group (B1)

After organosilane represented by $PhSiCl_3$ (27 mol) and $ClMe_2SiO(Me_2SiO)_{33}SiMe_2Cl$ (1 mol) and $MeHSiCl_2$ (3 mol) were dissolved into a toluene solvent, added dropwise into water, subjected to co-hydrolysis, washed with water and alkaline for neutralization and dehydrated, the solvent was stripped to synthesize a resin containing a hydrosilyl group (B1). In the resin, the composition ratio of a constituent siloxane unit and the structure represented by [—$SiMe_2$O-($Me_2SiO)_{33}$—$SiMe_2O_{2/2}$] is represented by the formula: $[PhSiO_{3/2}]_{0.27}[-SiMe_2O-(Me_2SiO)_{33}-SiMe_2O_{2/2}]_{0.01}[MeHSiO_{2/2}]_{0.03}$. The weight average molecular weight of the resin was 58,000, and the boiling point was 58° C.

Synthetic Example 3

Organopolysiloxane Resin Containing Vinyl Group (A2)

After organosilane represented by $PhSiCl_3$ (27 mol) and $ClMe_2SiO(Me_2SiO)_{33}SiMe_2Cl$ (1 mol) and $Me_2ViSiCl$ (3 mol) were dissolved into a toluene solvent, added dropwise into water, subjected to co-hydrolysis, washed with water and alkaline for neutralization and dehydrated, the solvent was stripped to synthesize a resin containing a vinyl group (A2). In the resin, the composition ratio of a constituent siloxane unit and the structure represented by [—$SiMe_2$O-($Me_2SiO)_{33}$—$SiMe_2O_{2/2}$] is represented by the formula: $[PhSiO_{3/2}]_{0.27}[-SiMe_2O-(Me_2SiO)_{33}-SiMe_2O_{2/2}]_{0.01}[Me_2ViSiO_{1/2}]_{0.03}$. The weight average molecular weight of the resin was 63,000, and the boiling point was 63° C.

Synthetic Example 4

Organopolysiloxane Resin Containing Hydrosilyl Group (B2)

After organosilane represented by $PhSiCl_3$ (27 mol) and $ClMe_2SiO(Me_2SiO)_{33}SiMe_2Cl$ (1 mol) and $Me_2HSiCl$ (3 mol) were dissolved into a toluene solvent, added dropwise into water, subjected to co-hydrolysis, washed with water and alkaline for neutralization and dehydrated, the solvent was stripped to synthesize a resin containing a hydrosilyl group (B2). In the resin, the composition ratio of a constituent siloxane unit and the structure represented by [—$SiMe_2$O-($Me_2SiO)_{33}$—$SiMe_2O_{2/2}$] is represented by the formula: $[PhSiO_{3/2}]_{0.27}[-SiMe_2O-(Me_2SiO)_{33}-SiMe_2O_{2/2}]_{0.01}[Me_2HSiO_{1/2}]_{0.03}$. The weight average molecular weight of the resin was 57,000, and the boiling point was 56° C.

Preparation Example 1

Preparation Example 1 of Composition of Thermosetting Silicone Resin 10 parts by mass of a phosphor (YAG) with a particle diameter of 5 μm (average particle diameter) and toluene (30 g) were added to 90 parts by mass of a base composition in which an organopolysiloxane resin containing a vinyl group (A1) of Synthetic Example 1 (189 g), an organopolysiloxane resin (B1) containing a hydrosilyl group of Synthetic Example 2 (189 g), an acetylene alcohol-based ethynyl cyclohexanol as a reaction inhibitor (0.2 g) and an octyl alcohol-modified solution of chloroplatinic acid (0.1 g) were added, and sufficiently agitated with a planetary mixer to prepare a thermosetting silicone resin composition. The composition was a liquid with a viscosity of 10 Pa·s at 25° C.

Preparation Example 2

Preparation Example 2 of Composition of Thermosetting Silicone Resin

As a replacement of the organopolysiloxane containing a vinyl group (A1) prepared in Synthetic Example 1, 30 parts by mass of a phosphor (YAG) having the same particle diameter as Example 1 of 5 μm (average particle diameter) and toluene (30 g) were added to 70 parts by mass of KJR-632L-1 (a product from Shin-Etsu Chemical Co., Ltd.) as a commercially available addition reaction curable silicone varnish whose base resin is an organopolysiloxane resin containing a vinyl group containing no linear diorganopolysiloxane chain structure with 5 to 300 repeating units that is a liquid at room temperature, and sufficiently agitated with a planetary mixer to prepare a silicone resin composition. The composition was a liquid with a viscosity of 10 Pa·s at 25° C.

Comparative Preparation Example 1

Comparative Preparation Example 1 of Composition of Thermosetting Silicone Resin 30 parts by mass of a phosphor (YAG) with a particle diameter of 5 μm (average particle diameter) was added to 70 parts by mass of a base composition in which an resin containing a vinyl group (A2) of Synthetic Example 3 (189 g), an resin containing a hydrosilyl group (B2) of Synthetic Example 4 (189 g), an acetylene alcohol-based ethynyl cyclohexanol as a reaction inhibitor (0.2 g) and an octyl alcohol-modified solution of chloroplatinic acid (0.1 g) were added, and sufficiently agitated with a planetary mixer heated to 60° C. to prepare a silicone resin composition. The composition was a plastic solid at 25° C. The softening temperature of the composition obtained was measured and was 65° C. like in Preparation Example 1.

Example 1

(1) Preparation of Phosphor-Containing Silicone Resin Sheet

The composition of Preparation Example 1 was printed into a desired element shape on a substrate film of fluorocarbon resin (PTFE film) with a screen printer, and dried at 100° C. for 5 minutes with a drier to mold it into a sheet as a cover film whose fluorocarbon resin (PTFE film) thickness is 50 μm.

(2) Encapsulation of LED Device on Ceramics Substrate

After the thermosetting silicone resin sheet obtained in Example 1 was aligned at the position of a chip together with a substrate film and a cover film, and the cover film was peeled from one surface of the sheet and placed on a GaN-based LED device to remove the substrate film from another surface so that a surface of the phosphor-containing silicone resin layer exposed comes into contact with an LED chip. Subsequently, after heating at 150° C. for 5 minutes, the phosphor-containing silicone resin layer was softened on an LED device to form a phosphor-containing silicone resin layer in which the entire LED device was coated and cured. Furthermore, the product was heated at 150° C. for 60 minutes for secondary curing. An emitting semiconductor (LED) device coated with the phosphor-containing silicone resin layer thus obtained was produced. A gold wire was bonded to a gold electrode of the LED device with a wire bonder to produce an LED. Thereafter, 3 sample LEDs were prepared and emitted and each chromaticity coordinate was measured with an LED optical property monitor (LE-3400, product of Otsuka Electronics Co., Ltd.). 3 average values were obtained.

Example 2

(1) Preparation of Phosphor-Containing Silicone Resin Sheet

The composition of Preparation Example 2 was printed into a desired element shape with a screen printer and the product was sandwiched between 2 fluorocarbon resin-coating PET films (substrate film and cover film), and compressive molded with a hot press at 80° C. for 5 minutes with a pressure of 5 t to prepare a film 70 μm thick whose both surfaces are attached with PET films.

(2) Encapsulation of LED Device on Ceramics Substrate

An LED device was encapsulated by the same method as described in the above Example 1 by using the thermosetting silicone resin sheet obtained in Example 2 and average chromaticity coordinates were obtained like in Example 1.

Comparative Example 1

A GaN-based LED device was adhered and mounted with a silicone resin die bond material in a reflector, and an LED device and an external electrode were bonded with a gold wire. Subsequently, the amount of a silicone resin composition produced in Comparative Preparation Example 1 was injected so as to entirely coat the reflector, and the silicone resin composition was cured at 60° C. for 30 minutes, at 120° C. for 1 hour, and at 150° C. for 1 hour to produce an emitting semiconductor device. 3 sample LEDs were prepared and emitted and each chromaticity coordinate was measured with an LED optical property monitor (LE-3400, product of Otsuka Electronics Co., Ltd.). 3 average values were obtained.

Measurement of Chromaticity Coordinate

Three emitting semiconductor devices produced in Examples 1 and 2 and Comparative Example 1 were prepared and each thereof was emitted and the variation in chromaticity coordinate was measured with an LED optical property monitor (LE-3400, product of Otsuka Electronics Co., Ltd.).

3 average values were obtained. Note: u': CIE1976 chromaticity coordinate calculated in compliance with JIS Z8726

TABLE 1

| Characteristic evaluation | | Example 1 | Example 2 | Comparative Example 1 |
|---|---|---|---|---|
| Variation in chromaticity coordinate | u' | ±0.001 | ±0.001 | ±0.006 |

(*) JIS Z8729: L*u*v color system

In Examples 1 and 2, the variations in chromaticity coordinate were significantly smaller than in Comparative Example 1. From this observation, the use of the phosphor-containing thermosetting silicone resin sheet of the present invention can obviously maintain uniform dispersion of a phosphor in a phosphor-containing thermosetting silicone resin layer in a stable manner. Additionally, an emitting semiconductor device that is uniform in phosphor dispersion and has no discoloration was obtained by using the phosphor-containing thermosetting silicone resin sheet. By using a silicone resin layer formed in the form of an LED device, working efficiency was higher than in Comparative Example.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

The invention claimed is:

1. A phosphor-containing thermosetting silicone resin sheet, comprising:
   a substrate film; and
   a plurality of phosphor-containing thermosetting silicone resin pieces arranged in a single, discontinuous layer on the substrate film;
   wherein:
   each phosphor-containing thermosetting silicone resin piece:
      is composed of a single layer of an uncured phosphor-containing thermosetting silicone resin composition that has a plastic solid or semi-solid state at room temperature, and
      has a surface shape that conforms to a shape of a surface of an LED device to which the phosphor-containing thermosetting silicone resin piece is intended to be laminated; and
   the phosphor-containing thermosetting silicone resin composition comprises:
   (A) a resin structure organopolysiloxane having an $R^1SiO_{1.5}$ unit, an $R^2{}_2SiO$ unit, and an $R^3{}_aR^4{}_bSiO_{(4-a-b)/2}$ unit, wherein:
      $R^1$, $R^2$, and $R^3$ each independently represents a methyl group, an ethyl group, a propyl group, a cyclohexyl group, or a phenyl group,
      $R^4$ independently represents a vinyl group or an allyl group,
      a is 0, 1, or 2,
      b is 1 or 2,
      a+b=2 or 3, and
      at least part of the $R^2{}_2SiO$ unit is in a continuous repeating sequence with 5 to 300 repeating units;

(B) a resin structure organohydrogen polysiloxane having an $R^1SiO_{1.5}$ unit, an $R^2{}_2SiO$ unit, and an $R^3{}_cH_dSiO_{(4-c-d)/2}$ unit, wherein:
      $R^1$, $R^2$, and $R^3$ are as defined in (A),
      c is 0, 1, or 2,
      d is 1 or 2,
      c+d=2 or 3,
      at least part of the $R^2{}_2SiO$ unit is in a continuous repeating sequence with 5 to 300 repeating units, and
      a molar ratio of a hydrogen atom bonded to a silicon atom in the (B) component relative to a total of a vinyl group and an allyl group in the (A) component is 0.1 to 4.0:
   (C) a platinum group metal-based catalyst, wherein the amount is a curing effective amount:
   (D) a phosphor; and
   (E) an organic solvent.

2. The phosphor-containing thermosetting silicone resin sheet according to claim 1, wherein a thickness of the plurality of phosphor-containing thermosetting silicone resin pieces is in a range from 20 to 200 μm.

3. The phosphor-containing thermosetting silicone resin sheet according to claim 1, wherein the phosphor of the (D) component is 0.1 to 300 parts by mass relative to 100 parts by mass totaling the (A) to (C) components.

4. The phosphor-containing thermosetting silicone resin sheet according to claim 1, wherein a particle diameter of the phosphor of the (D) component is 10 nm or more.

5. A method for producing a light-emitting apparatus, comprising:
   laminating a phosphor-containing thermosetting silicone resin piece selected from the phosphor-containing thermosetting silicone resin sheet according to claim 1 on an LED device surface; and
   thermally curing the phosphor-containing thermosetting silicone resin piece.

6. A light-emitting apparatus obtained by the method according to claim 5.

7. A phosphor-containing thermosetting silicone resin sheet, comprising:
   a substrate film;
   a plurality of phosphor-containing thermosetting silicone resin pieces arranged in a single, discontinuous layer on the substrate film; and
   a cover film covering the plurality of thermosetting silicone resin pieces;
   wherein:
   each phosphor-containing thermosetting silicone resin piece:
      is composed of a single layer of an uncured phosphor-containing thermosetting silicone resin composition that has a plastic solid or semi-solid state at room temperature, and
      has a surface shape that conforms to a shape of a surface of an LED device to which the phosphor-containing thermosetting silicone resin piece is intended to be laminated; and
   the phosphor-containing thermosetting silicone resin composition comprises:
   (A) a resin structure organopolysiloxane having an $R^1SiO_{1.5}$ unit, an $R^2{}_2SiO$ unit, and an $R^3{}_aR^4{}_bSiO_{(4-a-b)/2}$ unit, wherein:
      $R^1$, $R^2$, and $R^3$ each independently represents a methyl group, an ethyl group, a propyl group, a cyclohexyl group, or a phenyl group,
      $R^4$ independently represents a vinyl group or an allyl group, a is 0, 1, or 7,
b is 1 or 2,
a+b=2 or 3, and
at least part of the $R^2{}_2SiO$ unit is in a continuous repeating sequence with 5 to 300 repeating units;

(B) a resin structure, organohydrogen polysiloxane having an $R^1SiO_{1.5}$ unit, an $R^2{}_2SiO$ unit, and an $R^3{}_cH_dSiO_{(4-c-d)/2}$ unit, wherein:
$R^1$, $R^2$, and $R^3$ are as defined in (A),
c is 0, 1, or 2,
d is 1 or 2,
c+d=2 or 3,
at least part of the $R^2{}_2SiO$ unit is in a continuous repeating sequence with 5 to 300 repeating units, and
a molar ratio of a hydrogen atom bonded to a silicon atom in the (B) component relative to a total of a vinyl group and an allyl group in the (A) component is 0.1 to 4.0;

(C) a platinum group metal-based catalyst, wherein the amount is a curing effective amount:

(D) a phosphor; and (E) an organic solvent.

8. The phosphor-containing thermosetting silicone resin sheet according to claim 7, wherein a thickness of the plurality of phosphor-containing thermosetting silicone resin pieces is in a range from 20 to 200 μm.

9. The phosphor-containing thermosetting silicone resin sheet according to claim 2, wherein the phosphor of the (D) component is 0.1 to 300 parts by mass relative to 100 parts by mass totaling the (A) to (C) components.

10. The phosphor-containing thermosetting silicone resin sheet according to claim 7, wherein a particle diameter of the phosphor of the (D) component is 10 nm or more.

11. A method for producing a light-emitting apparatus, comprising:
laminating a phosphor-containing thermosetting silicone resin piece selected from the phosphor-containing thermosetting silicone resin sheet according to claim 7 on an LED device surface; and
thermally curing the phosphor-containing thermosetting silicone resin piece.

12. A light-emitting apparatus obtained by the method according to claim 11.

13. A method for producing a phosphor-containing thermosetting silicone resin sheet, comprising:
printing and molding a phosphor-containing thermosetting silicone resin composition on a substrate film to form a single, discontinuous layer of a plurality of phosphor-containing thermosetting silicone resin pieces, wherein each phosphor-containing thermosetting silicone resin piece has a surface shape that conforms to a shape of a surface of an LED device to which the phosphor-containing thermosetting silicone resin piece is intended to be laminated; and
coating a cover film on the plurality of phosphor-containing thermosetting silicone resin pieces;

wherein:
the phosphor-containing thermosetting silicone resin composition comprises:

(A) a resin structure organopolysiloxane having an $R^1SiO_{1.5}$ unit, an $R^2{}_2SiO$ unit, and an $R^3{}_aR^4{}_bSiO_{(4-a-b)/2}$ unit, wherein:
$R^1$, $R^2$, and $R^3$ each independently represents a methyl group, an ethyl group, a propyl group, a cyclohexyl group, or a phenyl group,
$R^4$ independently represents a vinyl group or an allyl group,
a is 0, 1, or 7,
b is 1 or 2,
a+b=2 or 3, and
at least part of the $R^2{}_2SiO$ unit is in a continuous repeating sequence with 5 to 300 repeating units;

(B) a resin structure organohydrogen polysiloxane having an $R^1SiO_{1.5}$ unit, an $R^2{}_2SiO$ unit, and an $R^3{}_cH_dSiO_{(4-c-d)/2}$ unit, wherein:
$R^1$, $R^2$, and $R^3$ are as defined in (A),
c is 0, 1, or
d is 1 or 2,
at least part of the $R^2{}_2SiO$ unit is in a continuous repeating sequence with 5 to 300 repeating units, and
a molar ratio of a hydrogen atom bonded to a silicon atom in the (B) component relative to a total of a vinyl group and an allyl group in the (A) component is 0.1 to 4.0;

(C) a platinum group metal-based catalyst, wherein the amount is a curing effective amount:

(D) a phosphor; and (E) an organic solvent.

14. The method for producing the phosphor-containing thermosetting silicone resin sheet according to claim 13, further comprising drying the organic solvent (E) from the plurality of phosphor-containing thermosetting silicone resin pieces.

* * * * *